United States Patent [15] 3,663,241
Short [45] May 16, 1972

[54] METALLIZING COMPOSITION CONTAINING NICKEL POWDER

[72] Inventor: Oliver Alton Short, Wilmington, Del.
[73] Assignee: E. I. du Pont de Nemours and Company, Wilmington, Del.

[22] Filed: May 20, 1970
[21] Appl. No.: 39,152

[52] U.S. Cl. ..................106/1, 106/1, 117/100 M, 117/130 R, 117/130 E, 117/160, 252/513
[51] Int. Cl. ..................C09d 5/24
[58] Field of Search ..................106/1, 193 M; 117/130, 131, 117/160, 100 M; 252/513

[56] References Cited

UNITED STATES PATENTS 2,908,568 10/1959 Crehan et al. ..................117/130 X
3,129,502 4/1964 Olson ..................117/130 X
3,484,284 12/1969 Dates et al. ..................106/1 X

*Primary Examiner*—Lorenzo B. Hayes
*Attorney*—James A. Forstner

[57] ABSTRACT

A mounting pad for aluminum terminated integrated circuit chips comprising a novel fired metallizing composition which comprises nickel powder coated with a nickel coating wherein said coating contains about from 0.1 to 14 percent by weight phosphorous as nickel phosphide.

5 Claims, No Drawings

METALLIZING COMPOSITION CONTAINING NICKEL POWDER

BACKGROUND OF THE INVENTION

This invention relates to printed circuits, and more particularly to printed circuit mounting pads for use with integrated circuit chips.

The use of integrated circuit chips in modern electronics has become widespread. Such chips usually include a plurality of active elements such as transistors, resistors, capacitors, and the like, intercoupled in an integral manner on a single silicon chip. In the past, chips were packaged individually in containers, such as cans or flat-packs, or mounted directly to hybrid packages, with individual leads connected to the package chips for connection to exterior circuitry. However, as packaging containers are relatively expensive and conventional chip-packaging techniques are costly, methods were developed whereby integrated circuit chips could be directly fixed to printed circuits. For example, copending coassigned U.S. Pat. application Ser. No. 790,734 filed Jan. 13, 1969, discloses a method utilizing thick film technology for mechanically forming metallic coatings to a precise geometry to provide coplanar lands and/or pedestal terminations for bonding to integrated circuit chips.

A primary consideration in these methods of bonding integrated circuit chips directly to printed circuits is that the terminal of the chip and the mounting pad of the printed circuit comprise compatible substances which will form strong bonds when bonded. This consideration is especially problematic when aluminum terminated integrated circuit chips are to be mounted on printed circuits having gold metallized surfaces, for when gold metallizations are bonded to aluminum, a gold-aluminum complex known as "purple plague" is produced which forms a very weak bond. Accordingly, there is needed a method for directly bonding aluminum terminated integrated circuit chips to printed circuits having gold metallized surfaces.

SUMMARY OF THE INVENTION

According to the present invention there is provided a mounting pad useful for directly bonding aluminum terminated integrated circuit chips to noble metal metallized printed circuits, especially those having gold metallized surfaces, which comprises a novel fired metallizing composition comprising nickel powder coated with a nickel coating wherein said coating contains about from 0.1 to 14 percent by weight phosphorous as nickel phosphide. The coated nickel powder can be prepared by electrolessly plating nickel powder with nickel-nickel phosphide. The coated powder is then formulated into a printing composition by dispersing it in an inert liquid vehicle, and printed in the form of bumps or pads over a noble metal metallized circuit pattern. The nickel bumps or pads are fired, coined if necessary to achieve coplanarity, and then used as mounting pads for aluminum-terminated chips, which can be mounted by conventional methods, e.g., thermal compression bonding.

DESCRIPTION OF THE PREFERRED EMBODIMENTS

The mounting pads of the present invention are made from a novel metallizing composition which comprises nickel powder coated with a nickel coating wherein said coating contains about from 0.1 to 14, preferably about from 2 to 10, percent phosphorous as nickel phosphide. The nickel powder should generally have an average particle size not exceeding 40 microns, with a particle size ranging from 0.01 to 10 microns being preferred.

The coated nickel powder can be prepared by electrolessly plating nickel powder with nickel-nickel phosphide in any suitable bath. A preferred bath is a nickel hypophosphite bath which comprises an aqueous solution of, by weight, about from 25 to 35 percent $NiCl_2.6H_2O$, 25 to 35 percent $NaH_2PO_2$, 50 to 60 percent glycolic acid and 15 to 25 percent NaOH. Conventional electroless plating techniques and conditions are employed.

The coated nickel powder will usually, although not necessarily, be dispersed in an inert liquid vehicle to form a printing composition. The proportion of the nickel powder to vehicle may vary considerably depending upon the manner in which the printing composition is to be applied and the kind of vehicle used. Generally, from one to 20 parts by weight of the nickel powder per part by weight of vehicle will be used to produce a printing composition of the desired consistency. Preferably three to 10 parts of nickel powder per part of vehicle will be used.

Any inert liquid may be employed as the vehicle. Water or any one of various organic liquids, with or without thickening and/or stabilizing agents, and/or other common additives, may be utilized as the vehicle. Examples of organic liquids that can be used are the higher alcohols such as decanol; esters of the lower alcohols, for example, the acetates and propionates; the terpenes such as pine oil, alpha- and beta-terpineol and the like; and solutions of resins such as the polymethacrylates of lower alcohols, or solutions of ethyl cellulose, in solvents such as pine oil or the monobutyl ether of ethylene glycol monoacetate. An ethyl cellulose-beta terpineol vehicle is one of the preferred vehicle systems. The vehicle may contain or be composed of volatile liquids to promote fast setting after application; or it may contain waxes, thermoplastic resins, or the like materials which are thermofluid so that the composition may be applied at an elevated temperature to a relatively cold ceramic substrate upon which the composition sets immediately.

The mounting pads are formed by applying the printing composition, e.g., by screen or mask stenciling, in the form of bumps or larger area pads over a noble metal metallized circuit pattern, preferably one having gold metallized surfaces. The bumps or pads are then fired in a reducing atmosphere for several minutes. The bumps or pads sinter to coherent masses which adhere to the metallized circuit pattern. After firing, the bumps or pads are cooled to about room temperature in the reducing atmosphere. The coated nickel bumps or pads can then be prepared for use as mounting pads for aluminum terminated integrated circuit chips, e.g., by coining to achieve coplanarity if necessary, etc. The method of mounting the chips can be any of the methods commonly used such as, for instance, thermal compression bonding.

Thus, the instant invention provides a method for directly bonding aluminum terminated integrated circuit chips to noble metal metallized printed circuits, especially those having gold metallized surfaces. When used with printed circuits having gold metallized surfaces, the "purple plague" problem associated with gold-aluminum bonds is eliminated. The novel mounting pads can be used to bond aluminum terminated chips to any noble metal metallized printed circuit, with the limitation that the metallization must be one which retains its conductivity and bondability during the firing of the plated nickel bumps. For example, a suitable metallization comprises noble metal and a non-reducible glass frit. Illustrative of non-reducible glass frits are the alkali-alkaline earth-borosilicate frits, which typically contain, in addition to $B_2O_3$ and $SiO_2$, such glass modifiers as $LiO_2$, $Na_2O$, $K_2O$, MgO, CaO, SrO, $TiO_2$, $ZrO_2$, $Al_2O_3$, or the like.

The following example further illustrates the present invention.

EXAMPLE

In 3 liters of water are dissolved 30 g. $NiCl_2.6H_2O$, 30 g. $NaH_2PO_2$, 55.3 g. glycolic acid and 20.4 g. NaOH. The pH of the solution is adjusted to 6 with acetic acid. The solution is heated to 90° C., and 10 g. of nickel powder with average particle size of about 1 micron are then added. After 75 minutes, the coated nickel, which has an average particle size of about 2 microns, is removed and formulated into a printing composition by dispersing it in a vehicle of 10 percent ethyl cellulose and 90 percent beta terpineol. The printing composition consists of 80 percent by weight of the coated nickel powder and 20 percent by weight of the vehicle.

The nickel printing composition is applied at desired locations by screen stenciling in the form of bumps over a prefired circuit pattern of a gold metallizing composition comprising, by weight, 91.5% gold powder and 8.5% glass frit which comprises 67.9% $SiO_2$, 4.6% $Na_2O$, 1.0% $K_2O$, 0.2% MgO, 24.6% $B_2O_3$ and 1.7% $Al_2O_3$. The bumps are then fired at 1,000° C. in a 15% $H_2$, 85% $N_2$ atmosphere for 5 minutes. After firing, the prints are cooled to room temperature in the $H_2$—$N_2$ atmosphere. The nickel bumps are then coined to achieve coplanarity. Aluminum terminated integrated circuit chips are bonded to the nickel pads by thermal compression bonding. In each case, when stress is applied to the circuit chips, the chips fracture before the bonds break, thus indicating adequate bond strength. Also, the printed circuit retains its conductivity.

What is claimed is:

1. A metallizing composition comprising nickel powder electrolessly coated with a nickel coating containing about from 0.1 to 14 percent by weight phosphorous as nickel phosphide an and inert organic vehicle, wherein said nickel powder has an average particle size not exceeding 40 microns.

2. A composition of claim 1 wherein said nickel coating contains about from 2 to 10 percent by weight phosphorous as nickel phosphide.

3. A printing composition of claim 1 wherein said inert vehicle comprises ethyl cellulose and beta terpineol.

4. A composition according to claim 1 wherein there are one to 20 parts metallizing composition per part vehicle, by weight.

5. A composition according to claim 3 wherein there are one to 20 parts metallizing composition per part vehicle, by weight.

* * * * *